United States Patent
Hack et al.

(10) Patent No.: US 11,716,863 B2
(45) Date of Patent: Aug. 1, 2023

(54) HYBRID DISPLAY ARCHITECTURE

(71) Applicant: Universal Display Corporation, Ewing, NJ (US)

(72) Inventors: Michael Hack, Carmel, CA (US); Michael Stuart Weaver, Princeton, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 117 days.

(21) Appl. No.: 17/234,303

(22) Filed: Apr. 19, 2021

(65) Prior Publication Data

US 2021/0351247 A1  Nov. 11, 2021

Related U.S. Application Data

(60) Provisional application No. 63/022,653, filed on May 11, 2020.

(51) Int. Cl.
| | | |
|---|---|---|
| *H01L 27/32* | (2006.01) | |
| *H01L 51/50* | (2006.01) | |
| *G09G 3/3275* | (2016.01) | |
| *H01L 51/56* | (2006.01) | |
| *H10K 19/20* | (2023.01) | |

(Continued)

(52) U.S. Cl.
CPC .......... *H10K 19/20* (2023.02); *G09G 3/3275* (2013.01); *H10K 50/115* (2023.02); *H10K 59/351* (2023.02); *H10K 59/352* (2023.02); *H10K 59/353* (2023.02); *H10K 59/70* (2023.02); *H10K 71/00* (2023.02)

(58) Field of Classification Search
CPC ................ H01L 27/286; H01L 51/502; H10K 59/351–353; H10K 59/70; H10K 19/20
See application file for complete search history.

(56) References Cited

U.S. PATENT DOCUMENTS

| | | | |
|---|---|---|---|
| 4,769,292 A | 9/1988 | Tang | |
| 5,247,190 A | 9/1993 | Friend | |

(Continued)

FOREIGN PATENT DOCUMENTS

| | | | | |
|---|---|---|---|---|
| CN | 108269832 | * | 7/2018 | ......... G02F 1/13338 |
| CN | 109949768 | * | 6/2019 | ............... G09G 3/32 |

(Continued)

OTHER PUBLICATIONS

Machine translation, Wu, Chinese Pat. Pub. No. CN108269832, translation date: Jan. 25, 2032, Clarivate Analytics, all pages. (Year: 2023).*

(Continued)

*Primary Examiner* — Victoria K. Hall
(74) *Attorney, Agent, or Firm* — Butzel Long

(57) ABSTRACT

Embodiments of the disclosed subject matter provide a full-color pixel arrangement for a full-color display is provided, the arrangement having a plurality of pixels, with each pixel including a first sub-pixel comprising a Group III-V inorganic emissive thin film configured to emit light of a first color, where there is at least one first sub-pixel per pixel of the full-color pixel arrangement. Each pixel may include an organic second sub-pixel and an organic third sub-pixel that are configured to emit light of a different color than the first color.

19 Claims, 5 Drawing Sheets

(51) Int. Cl.
*H10K 50/115* (2023.01)
*H10K 59/35* (2023.01)
*H10K 71/00* (2023.01)
*H10K 59/70* (2023.01)

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 9,065,010 B2* | 6/2015 | Forrest ............. H01L 27/14618 |
| 9,716,082 B2* | 7/2017 | Bower .................. H05B 47/10 |
| 9,818,804 B2* | 11/2017 | Hack .................. H01L 27/3225 |
| 10,128,319 B2* | 11/2018 | Hack .................. H01L 27/3213 |
| 10,192,932 B2* | 1/2019 | Steckel ................ H01L 51/502 |
| 10,229,956 B2* | 3/2019 | Hack .................. H01L 51/5265 |
| 10,243,018 B2* | 3/2019 | Forrest ............. H01L 27/14636 |
| 10,243,023 B2* | 3/2019 | Hack .................. H01L 51/5265 |
| 10,263,050 B2* | 4/2019 | Hack .................. H01L 27/3225 |
| 10,461,131 B2* | 10/2019 | Steckel .............. H01L 51/5278 |
| 10,916,704 B2* | 2/2021 | Hack .................. H01L 51/5253 |
| 11,450,822 B2 | 9/2022 | Boudreault ......... H01L 51/0085 |
| 2003/0230980 A1 | 12/2003 | Forrest |
| 2004/0174116 A1 | 9/2004 | Lu |
| 2007/0205423 A1* | 9/2007 | Yamazaki ........... H01L 27/3213 428/917 |
| 2015/0213747 A1 | 7/2015 | Adamovich |
| 2015/0340410 A1* | 11/2015 | Hack .................. H01L 27/3218 438/35 |
| 2016/0218150 A1* | 7/2016 | Hack .................. H01L 51/5056 |
| 2016/0232265 A1* | 8/2016 | Thompson ......... H01L 51/0032 |
| 2017/0084671 A1* | 3/2017 | Hack ...................... H10K 59/00 |
| 2017/0221969 A1* | 8/2017 | Steckel .............. H01L 51/5044 |
| 2017/0229520 A9* | 8/2017 | Hack .................. H01L 51/5265 |
| 2017/0229663 A1 | 8/2017 | Tsai |
| 2018/0069059 A1* | 3/2018 | Hack .................. H01L 27/3213 |
| 2018/0166512 A1* | 6/2018 | Hack .................. H01L 27/3218 |
| 2019/0131356 A1* | 5/2019 | Steckel .............. H01L 51/5044 |
| 2019/0237618 A1* | 8/2019 | Zou ........................ H01L 33/06 |
| 2019/0280048 A1* | 9/2019 | Maindron ............... H01L 51/56 |
| 2019/0305224 A1* | 10/2019 | Hack .................. C23C 16/45574 |
| 2019/0339570 A1* | 11/2019 | Chen .................. H01L 51/5281 |
| 2020/0287162 A1* | 9/2020 | Chung ............... H01L 27/3248 |
| 2021/0167291 A1* | 6/2021 | Hack .................. H01L 51/5253 |
| 2021/0211641 A1* | 7/2021 | Do ....................... G09G 3/2003 |

FOREIGN PATENT DOCUMENTS

| | | |
|---|---|---|
| WO | 2008057394 A1 | 5/2008 |
| WO | 2010011390 A2 | 1/2010 |
| WO | 2020036278 | 2/2020 |

OTHER PUBLICATIONS

Machine translation, An, Chinese Pat. Pub. No. CN109949768, translation date: Jan. 25, 2032, Clarivate Analytics, all pages. (Year: 2023).*

Baldo et al. Highly efficient phosphorescent emission from organic electroluminescent devices, Nature, vol. 395, pp. 151-154, 1998.

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

George et al., "Electrically tunable diffractiion efficiency from gratings in Al-doped ZnO", Applied Physics Letters 110, 071110, 2017.

"Insight into the performance of multi-color InGaN/GaN nanorod light emitting diodes", Y. Robin, S. Y. Bae, T. V. Shubina, M. Pristovsek, E. A. Evropeitsev, D. A. Kirilenko, V. Yu. Davydov, A. N. Smirnov, A. A. Toropov, V. N. Jmerik, M. Kushimoto, S. Nitta, S. V. Ivanov & H. Amano, Nature Scientific Reports vol. 8, Article No. 7311 (2018).

* cited by examiner

FIG. 3 - RGY OLED implementation, with at least one inorganic blue sub-pixel per pixel Anode pads for nanorods Width of printed nanorod deposition FIG. 4 – RGY OLED implementation, with at least one inorganic blue sub-pixel shared per 2 pixels

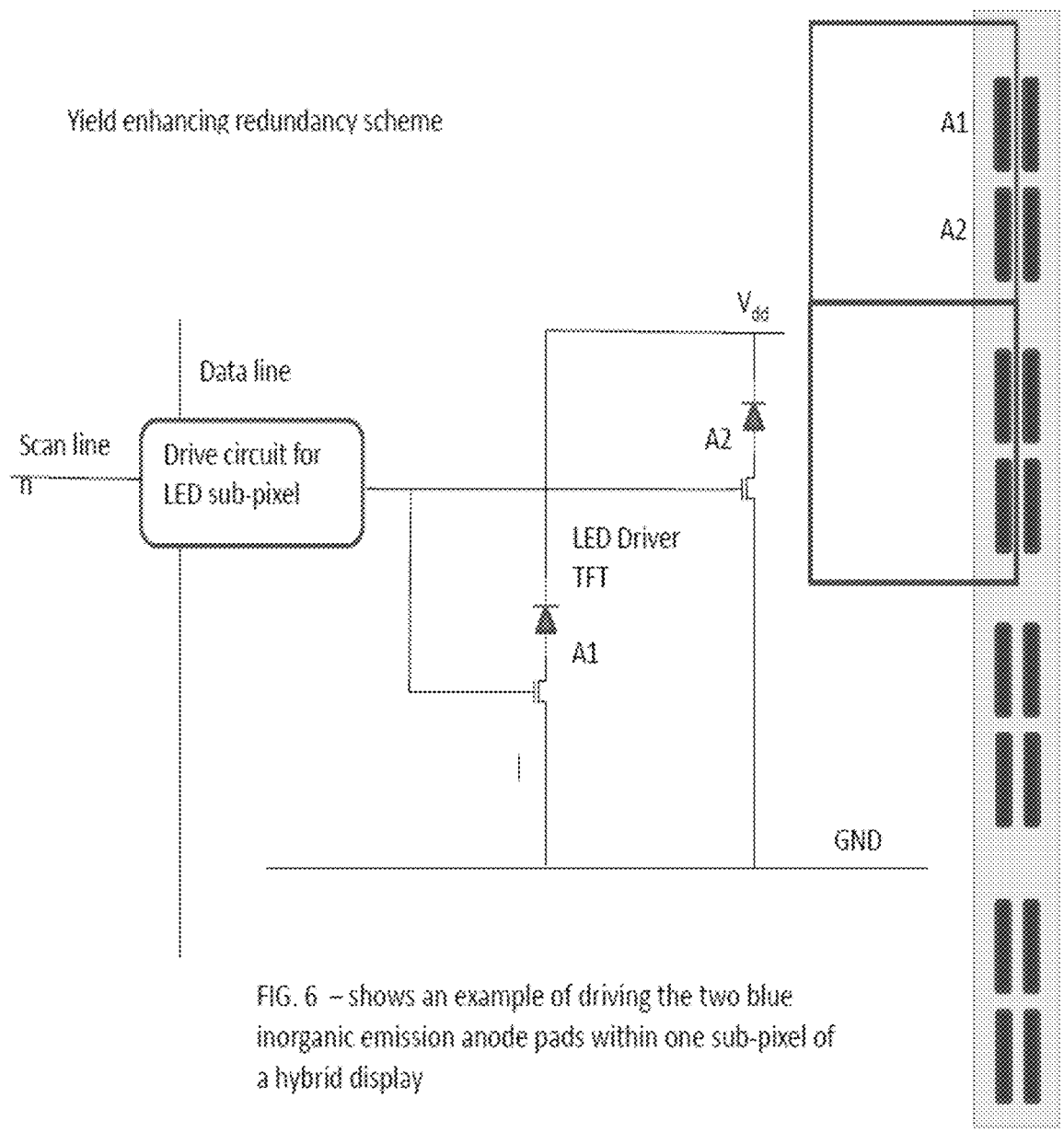
FIG. 6 – shows an example of driving the two blue inorganic emission anode pads within one sub-pixel of a hybrid display

HYBRID DISPLAY ARCHITECTURE

CROSS-REFERENCE TO RELATED APPLICATIONS

This application claims priority to U.S. Patent Application Ser. No. 63/022,653, filed May 11, 2020, the entire contents of which are incorporated herein by reference.

FIELD

The present invention relates to devices and techniques for fabricating hybrid displays that include organic and inorganic emissive devices, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. Light emitted from an organic stack, or from an inorganic light emitting device, may be modified by either a downconversion or upconversion process whereby the energy of the emitted photon is changed to alter its color, or else by use of a color filter which filters out selective photon energies. Both of these processes may be enabled by thin layers of materials known as color altering layers. The use of an optical cavity may modify the distribution of energies of the photons emitted from the actual light emitting region of a device. The initial light generation typically is the result of an energy level change resulting in emission of a photon. For example, an organic emissive material may initially generate blue light, which may be converted by a quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321] |
| Central Blue | Locus: [0.1746, 0.0052]; [0.0326, 0.3530]; Interior: [0.2268, 0.3321] |
| Central Yellow | Locus: [0.3731, 0.6245]; [0.6270, 0.3725]; Interior: [0.3700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a full-color pixel arrangement for a full-color display is provided, the arrangement having a plurality of pixels, with each pixel including a first sub-pixel comprising a Group III-V inorganic emissive thin film configured to emit light of a first color, where there is at least one first sub-pixel per pixel of the full-color pixel arrangement. Each pixel may include an organic second sub-pixel and an organic third sub-pixel that are configured to emit light of a different color than the first color.

The Group III-V inorganic emissive thin film may include inorganic emitting nanorods. For example, the inorganic emitting nanorods may include GaN.

The first sub-pixel of the full-color pixel arrangement may have a plurality of emissive regions. The plurality of emissive regions may be independently addressable.

The second sub-pixel of the full-color pixel arrangement may be configured to emit light of a second color, and the third sub-pixel may be configured to emit a third color. In some embodiments, the second sub-pixel may include a first portion of an organic emissive stack configured to emit an initial color different from the first color. The third sub-pixel may include a second portion of the first organic emissive stack, and a first color altering layer disposed in a stack with the second portion of the first organic emissive stack. In some embodiments, the full-color pixel arrangement may include a fourth sub-pixel that may be configured to emit light of a fourth color that is different from the initial color. The fourth sub-pixel may include a third portion of the first organic emissive stack, and may include a second color altering layer disposed in a stack with the third portion of the first organic emissive stack. In some embodiments, the first color may be blue, the second color may be green, the third color may be red, and the fourth color may be yellow. The fourth sub-pixel may be configured to emit light of a different color than the first color.

The organic emissive stack of the full-color pixel arrangement may be disposed on at least one of a plurality of independently addressable emissive regions of the Group III-V inorganic emissive thin film. The organic emissive stack may be disposed in a non-overlapping arrangement to the Group III-V inorganic emissive thin film.

In some embodiments, the organic emissive stack of the full-color pixel arrangement may be part of an organic light emitting device (OLED). The OLED may include a phosphorescent emissive region. The OLED may include a thermally activated delayed fluorescence (TADF) material or electrically-driven quantum dots disposed in the organic emissive stack. The OLED may be yellow that is unpatterned at the scale of the display pixels, and green and red light may be provided from the yellow light via color filters or color changing media.

In some embodiments, the second sub-pixel of the full-color pixel arrangement may be disposed adjacent to the first sub-pixel and is configured to emit an initial color different from the first color. The third sub-pixel may include a first color altering layer disposed on at least one of the first sub-pixel and the second sub-pixel. The full-color pixel arrangement may include a fourth sub-pixel is configured to emit light a fourth color different from the initial color, the fourth sub-pixel disposed adjacent to the first sub-pixel, the second sub-pixel, and the third sub-pixel. In some embodiments, the first color may be blue, the second color may be green, the third color may be red, and the fourth color may be yellow. In some embodiments, the fourth sub-pixel may be configured to emit light of a different color than the first color.

In some embodiments, at least the first sub-pixel and the second sub-pixel of the full-color pixel arrangement may be part of an organic light emitting device (OLED). The OLED may include a phosphorescent emissive region. The OLED may include a thermally activated delayed fluorescence (TADF) material or electrically-driven quantum dots. In some embodiments, the OLED may be unpatterned yellow, and green and red light may be generated via color filters or color changing media.

In some embodiments of the full-color pixel arrangement, the inorganic emissive thin film may be deposited using at least one of thermal evaporation, deposition through a mask, cold welding, printing in a gas phase (OVJP), printing in a liquid solvent (e.g. ink jet printing), and/or patterning.

In some embodiments of the full-color pixel arrangement, the inorganic emissive thin film may be deposited using one or more fabrication processes. In one approach, a buffer layer such as $SiO_2$ may be patterned on the sapphire and a multi-quantum well InGaN/GaN may be selectively grown by metal organic chemical vapor deposition (MOCVD) or molecular beam epitaxy (MBE) on a predefined area. After the growth of the nanorod, the sapphire substrate may be detached using a laser lift-off technique. In another approach, patterning methods such as etching may be introduced as a low-cost but highly efficient way toward fabrication of high-aspect-radio 3D GaN micro-structure and/or nanostructures. GaN nanoLEDs may be fabricated by etching planar GaN LEDs with nanomasks. The GaN nanorods may be defined by photolithography, e-beam lithography, and nanoimprint lithography or other low-cost methods, such as $SiO_2$ nanosphere lithography. Dry etching methods, such as Reactive Ion Etching, may be used to achieve high aspect ratio. The nanorods may be integrated onto the display backplane to form the device. An inkjet printing technique may be selected for the deposition of the nanorods. Since the dimensions of the nanorods are small, an electrode may be formed on thin film transistor (TFT) to align the electric field before deposition of the nanorods to avoid random orientation of the nanorods.

In the full-color pixel arrangement, the first color may be blue, the second color may be green, and the third color may be red.

An emissive area of the first sub-pixel of the full-color pixel arrangement may be less than 50%, less than 25%, or less than 10% of an area of the first sub-pixel.

In some embodiments, the full-color pixel arrangement may include a scattering layer that is disposed on the inorganic emissive thin film. The first sub-pixel may be configured to receive pulsed waveforms from a controller to maintain a fixed color spectrum.

The first color generated by the inorganic emissive thin film of the full-color pixel arrangement may be based on a function of electrical power applied to the inorganic emissive thin film and a value from a color look-up table.

The full-color pixel arrangement may include a data driver configured to drive two or more anode pads of the inorganic emissive thin film regions of the first sub-pixel. The data driver may be configured to determine whether any of the two or more anode pads are non-functional, and mapping non-functional emissive areas based on the determination. A controller may be configured to change a light output from the first sub-pixel if one of the two or more anode pads is non-operational to provide a predetermined sub-pixel luminance. The data driver may be configured to drive at least one of the first sub-pixel, the second sub-pixel, the third sub-pixel.

The full-color pixel arrangement may include an angular dependence emission of cavities of the plurality of independently addressable emissive regions that may be tuned to a predetermined angular dependence.

The first sub-pixel of the full-color pixel arrangement may be shared with at least one other pixel of the full-color pixel arrangement.

According to an embodiment, a method may be provided for forming a full-color pixel arrangement for a full-color display, the arrangement having a plurality of pixels, where forming each pixel may include forming a first sub-pixel comprising a Group III-V inorganic emissive thin film configured to emit light of a first color, where there is at least one first sub-pixel per pixel of the full-color pixel arrangement. The method may include forming an organic second sub-pixel and an organic third sub-pixel that are configured to emit light of a different color than the first color.

The method may include forming the Group III-V inorganic emissive thin film of the first sub-pixel using inorganic emitting nanorods.

The forming the first sub-pixel of the full-color pixel arrangement may include forming the first sub-pixel with a plurality of emissive regions. The forming the first sub-pixel of the full-color pixel arrangement may include forming the plurality of emissive regions to be independently addressable. The forming of the second sub-pixel may include forming a first portion of an organic emissive stack configured to emit an initial color different from the first color.

The method may include forming the organic emissive stack as part of an organic light emitting device (OLED). The OLED may be deposited using at least one of Organic Vapor Jet Printing (OVJP), ink jet printing (IJP), Organic Vapor Phase Deposition (OVPD), Vacuum Thermal Evaporation (VTE), organic molecular beam deposition, spin coating, doctor blade, thermal transfer, stamping, lithography, spray transfer, atomic layer deposition (ALD), Langmuir-Blodgett film deposition, and/or chemical vapor deposition, and/or self-assembled films.

At least the first sub-pixel and the second sub-pixel of the full-color pixel arrangement may be part of an organic light emitting device (OLED). The OLED may be deposited using at least one of Organic Vapor Jet Printing (OVJP), ink jet printing (IJP), Organic Vapor Phase Deposition (OVPD), Vacuum Thermal Evaporation (VTE), organic molecular beam deposition, spin coating, doctor blade, thermal transfer, stamping, lithography, spray transfer, atomic layer deposition (ALD), Langmuir-Blodgett film deposition, and/or chemical vapor deposition, and/or self-assembled films.

BRIEF DESCRIPTION OF THE DRAWINGS

FIG. 6 shows an example of driving two blue inorganic emission anode pads within one sub-pixel of a hybrid display according to an embodiment of the disclosed subject matter.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
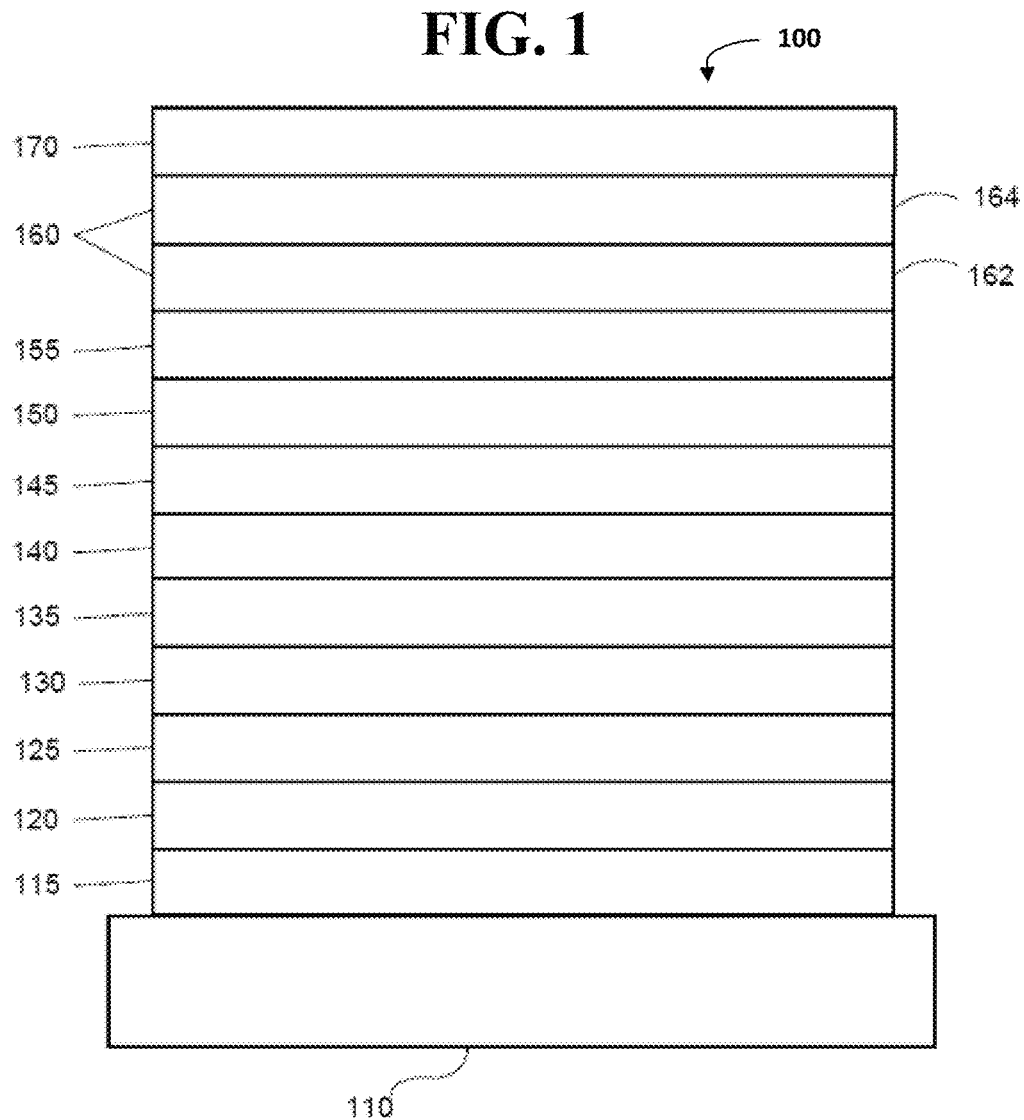
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
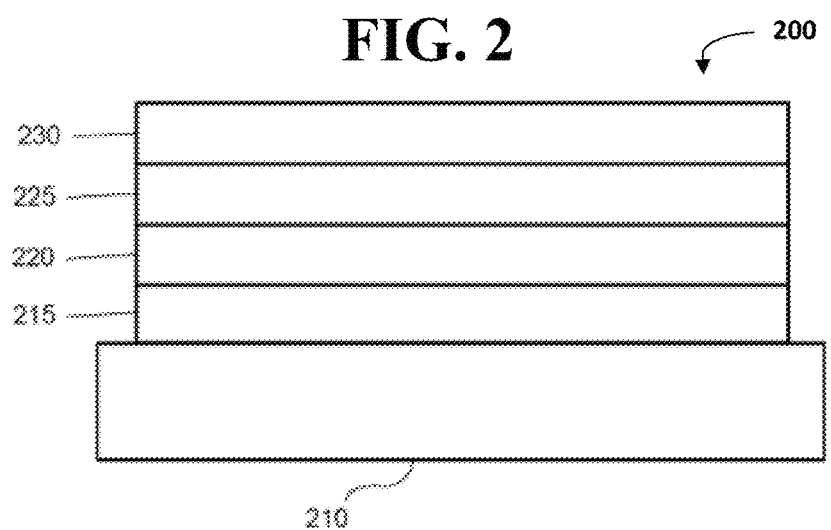
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C. to 30 C., and more preferably at room temperature (20-25 C.), but could be used outside this temperature range, for example, from −40 C. to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Embodiments of the disclosed subject matter provide improved designs, operations, and methods of forming hybrid displays based on blue microLEDs (micro light emitting devices) and unpatterned yellow OLEDs (organic light emitting devices) using green and/or red color filters. That is, the OLED may emit yellow light, and filters and/or color changing media may be used to produce green light and/or red light. In some embodiments, green, red, and/or yellow light may come from OLED sub-pixels where the organic emissive stack has been patterned at the sub-pixel scale.

Red and green OLED sub-pixels may be integrated with lower resolution blue inorganic microLED-based sub-pixels. This arrangement provides a high brightness, long lifetime display with a low density of blue microLEDs. The combination of OLEDs and LEDs in pixels of a display device may provide easier manufacturing, as this architecture does not need close to perfect microLED yield, as the microLEDs are used to produce blue sub-pixels, and the human eye does not resolve blue color to the same resolution as green or red light.

Embodiments of the disclosed subject matter use printed QNED (quantum nanocell emitting diodes) technology in which GaN-based blue light emitting nanorod LEDs may replace discreet inorganic LEDs as the blue light source. This may provide improved yield at a lower cost.

The GaN nanorods may be printed by OVJP (organic vapor jet printing), as opposed to ink jet printing. OVJP may allow for a bias to be applied to facilitate alignment of the nanorods on the display substrate.

Embodiments of the disclosed subject matter may combine blue emitting nanorods as the source of pixelated blue light for a full color display with red and green OLED sub-pixels. The nanorods and/or OLED sub-pixels may be formed either by directly printed using dry (OVJP) or solvent based (ink jet printing (IJP)) OLED printing processes, or by use of unpatterned yellow OLED deposition where green and red sub-pixels may be defined using color filters and/or color changing media. The formation and/or transfer processes of the nanorods may lead to a less than perfect yield for any given emission region because of the shorting between two electrodes deposited to power the nanorods. Embodiments of the disclosed subject matter may improve display yields over other microLED based designs. As the eye has a much lower ability to resolve blue sub-pixels than green or red, if there are a few non-functioning blue sub-pixels it is likely that they will not be "seen" by the human eye. Non-functioning blue sub-pixels may be compensated for, as disclosed, for example, in U.S. Pat. No. 10,263,050, which is incorporated by reference in its entirety. If only nanorods are used to provide light for all three RGB (Red Green Blue) sub-pixels, then 100% yield may be required. Embodiments of the disclosed subject matter may use high yield OLEDs to provide colors other than blue. The use of a redundancy scheme may improve display yields. In conventional microLED displays, redundancy may be provided by depositing and/or placing multiple LED dies in a given sub-pixel, which may increase display cost. By printing the nanorods, multiple anode pads maybe placed within one sub-pixel and coated by the same printing process as disclosed throughout. The use of a plurality of anode pads for the nanorods within one sub-pixel may provide redundancy against shorting from anode to cathode in any given emissive region. This process may apply to an all nanorod driven display.

Figure 3:
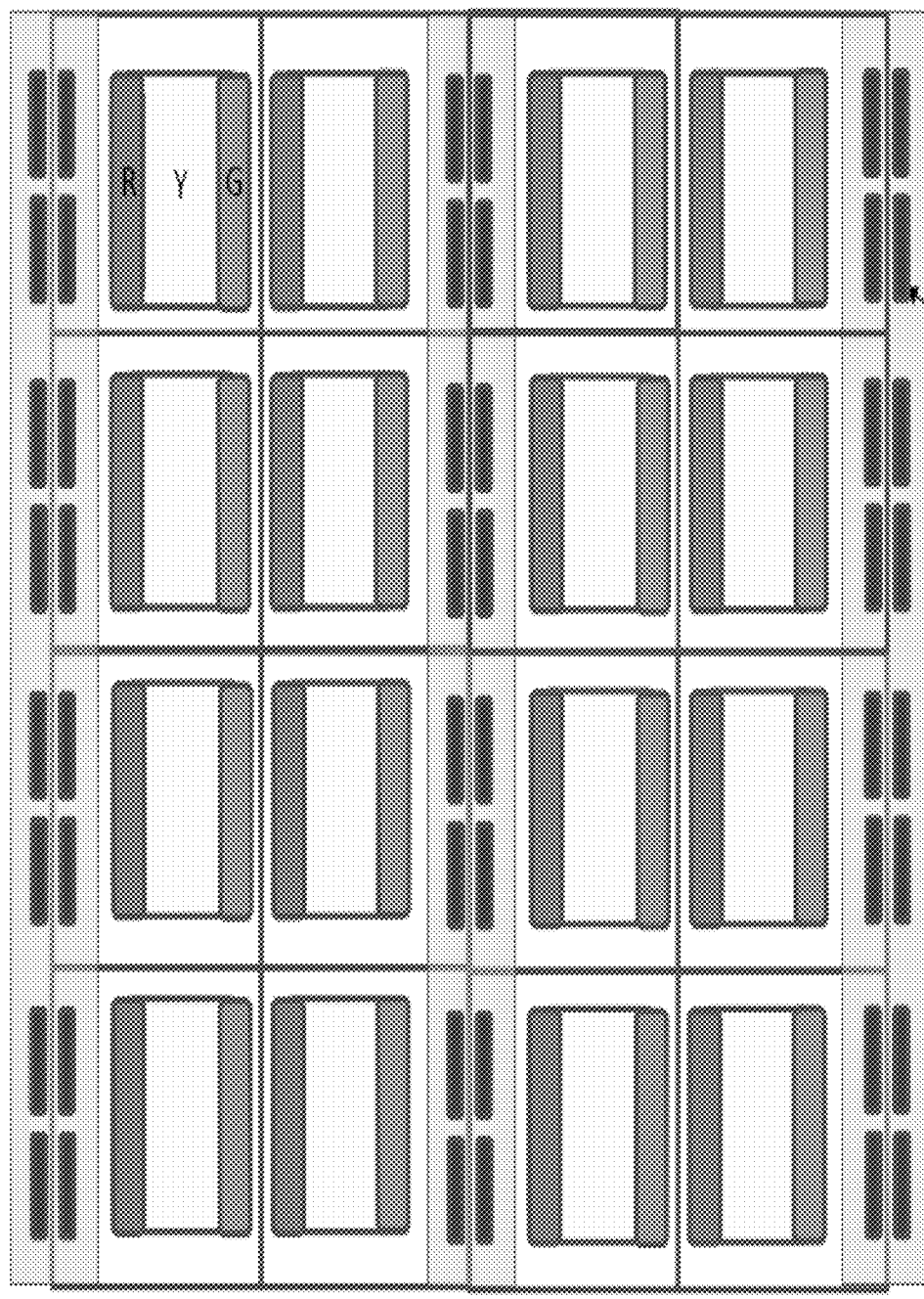
FIG. 3 shows an OLED device that includes at least one inorganic blue sub-pixel per pixel according to an embodiment of the disclosed subject matter.

FIG. 3 shows a layout for a RGBY (Red Green Blue Yellow) display based on blue emitting nanorods and unpatterned yellow OLEDs with color filters and/or color changing media to define green and red sub-pixels according to embodiments of the disclosed subject matter. There may be two nanorod anodes per sub-pixel, with one blue sub-pixel per pixel. As shown in FIG. 3, the blue sub-pixels may be arranged so that one printing stripe can coat two pixels simultaneously. That is, the number of printing lines for the overall display may be halved, and equal to half the number of pixel columns.

Figure 4:
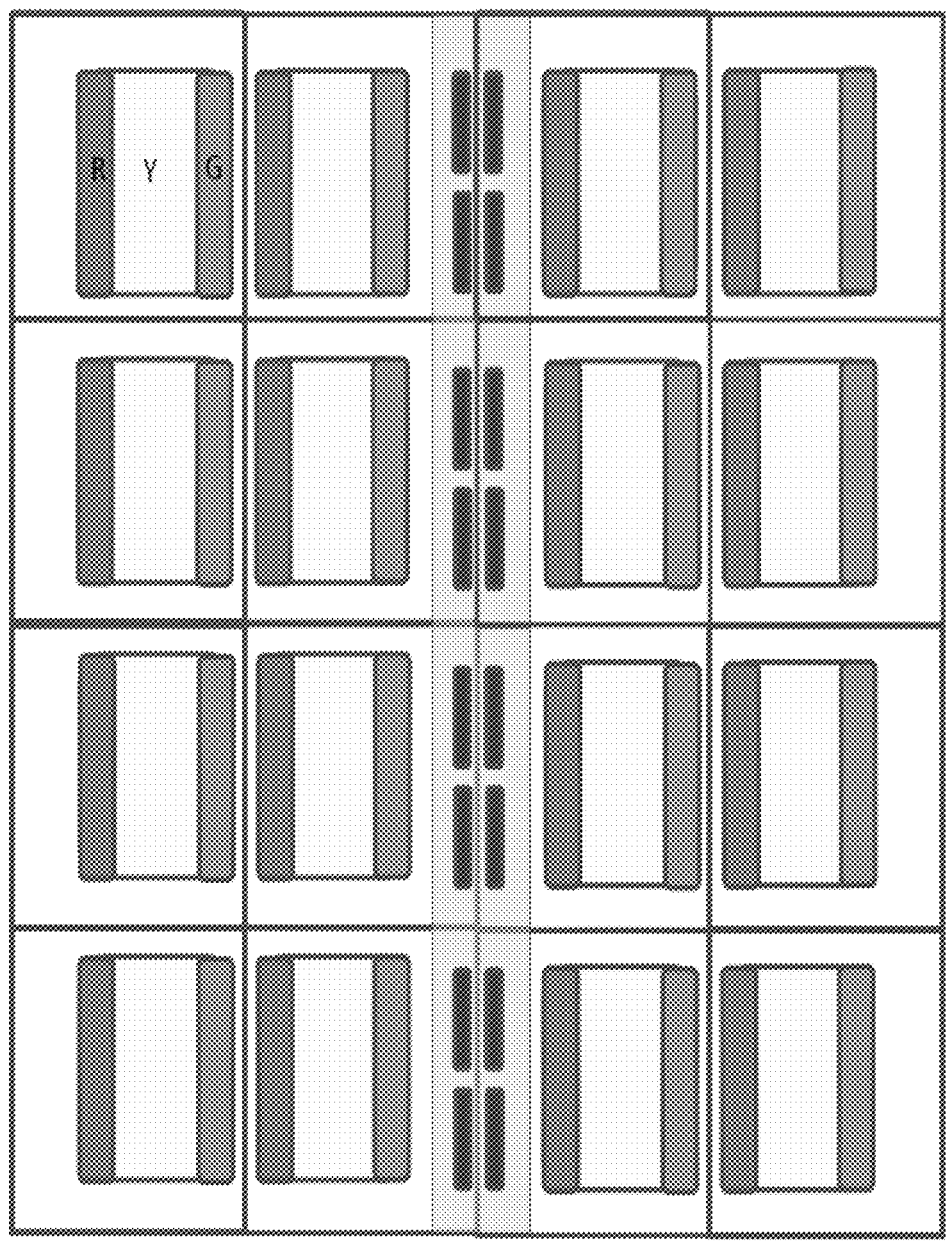
FIG. 4 shows an OLED device that includes at least one inorganic blue sub-pixel shared per two pixels according to an embodiment of the disclosed subject matter.

FIG. 4 shows a similar layout to the embodiment shown in FIG. 3, but the blue sub-pixel may be used for every two pixels.

Figure 5:
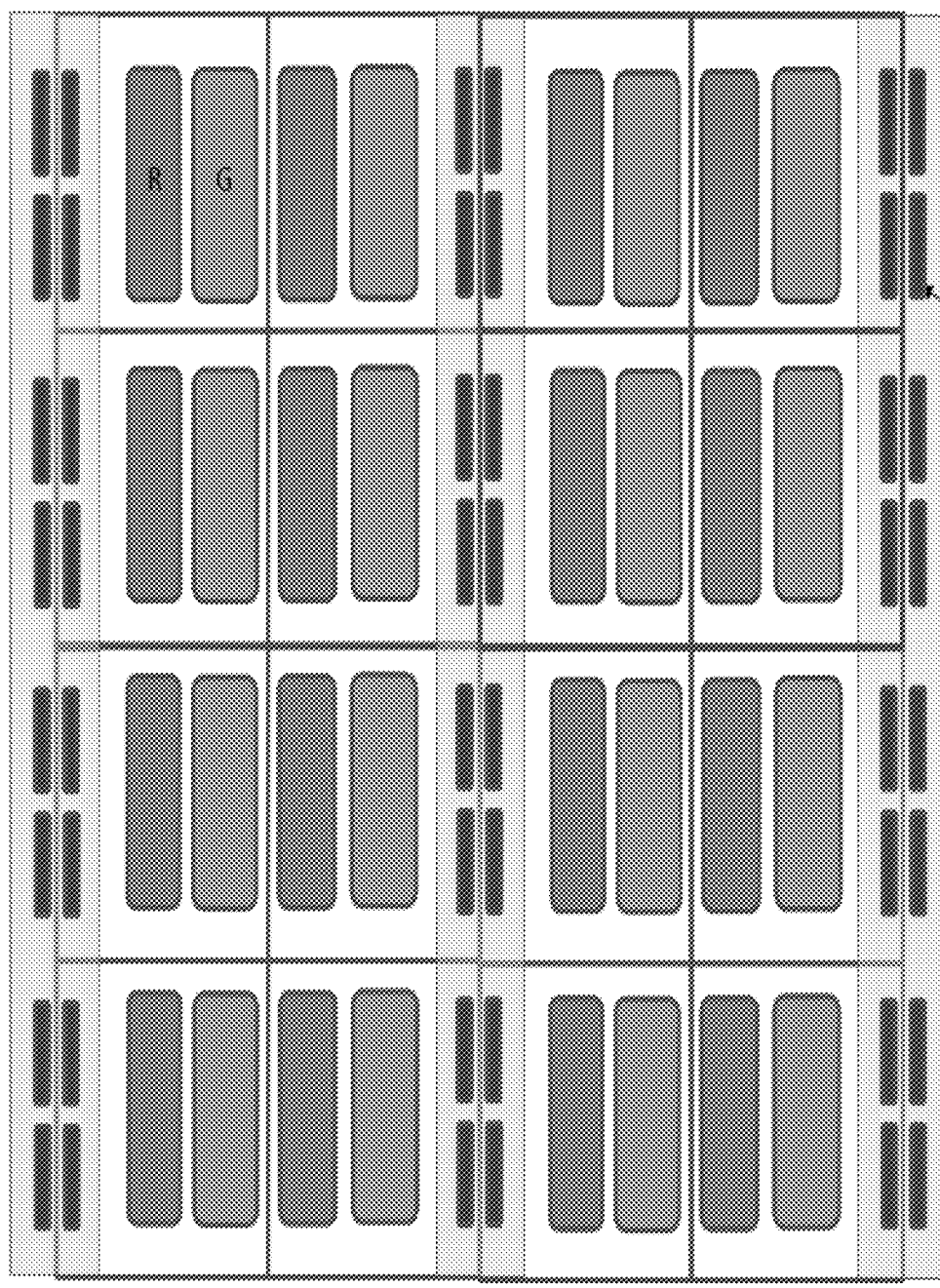
FIG. 5 shows an OLED device that includes at least one inorganic blue sub-pixel per pixel according to an embodiment of the disclosed subject matter.

FIG. 5 shows a hybrid display that includes red and green OLEDs according to an embodiment of the disclosed subject matter. The green and red OLEDs may be printed, as opposed to using unpatterned yellow OLEDs and color filters and/or color changing media. The green and red OLEDs may be printed, for example, using OVJP, IJP (with or without solvent), or the like.

FIG. 6 shows an example of driving the two blue inorganic emission anode pads within one sub-pixel of a hybrid display to provide redundancy if one region is shorted. The embodiment shown in FIG. 6 may be an example of a redundancy scheme to improve nanorod yield. Each nanorod anode in a sub-pixel may be driven by its own driver, such as a thin film transistor (TFT) or the like. The sub-pixel driving circuit may be a conventional current driven OLED driver or else a pulse width modulated approach as disclosed, for example, in U.S. Pat. No. 10,263,050. The subpixel driver may produce a voltage which is supplied to the gate of the transistor driving each anode pad, so the same voltage can supply each of the 2 driver TFTs. In some embodiments, fully independent driving circuits may be used, so that the TFTs are independently driven. If one anode has nanorods which short the anode to its cathode, the emission area may not light up, but the other anode pad in that sub-pixel may still be functional. In this case, a correction may be applied such that after the display is made and all the pixels are turned on, a map may be recorded of non-functioning emissive areas. The mapping information may be stored in a memory, and a controller may be configured to double the light output from sub-pixel emissive regions when only one of the two areas is operational. In some implementations, three or more independently driven anode regions may be employed in each sub-pixel illuminated by inorganic nanorods.

To ensure high efficiency nanorod output, the emission area of the blue light may be reduced, so as to make the emissive anode pads a small area relative the area of printed nanorods. This may also improve the yield. The emissive area of blue sub-pixels may be less than 50%, less than 25%, or less than 10% or the like of the printed nanorod area.

Embodiments of the disclosed subject matter may use fault tolerant sub-pixels with a plurality of independently driven anodes to apply to an all nanorod-based display, where nanorods may be used to generate three or more colors based on their blue light emission and subsequent quantum dot down conversion.

In some embodiments, the same data driver may be used to drive inorganic and organic sub-pixels, such as disclosed, for example, in U.S. Pat. No. 10,263,050, which is incorporated by reference in its entirety.

A hybrid approach of using OLEDs to produce the non-blue colors may be more efficient than using quantum dots to downconvert blue to other colors. Yellow OLEDs, along with red and green OLEDs may provide close to 100% internal quantum efficiency (IQE). That is, even if the nanorods may provide 100% IQE, after downconversion, the effective IQE for red and green may be lower.

In some embodiments, OLEDs may be placed at same level as the nanorods so they can share a common cathode, or the OLEDs could be deposited over the nanorods as outlined in our prior hybrid disclosures.

The LED nanorods may have a directional emission pattern. This may be suitable in specific applications where a display may be viewed predominantly perpendicular to the display surface, such as in mobile device applications (e.g., smartphones, tablets, smartwatches, wearable computing devices, and the like). The output emission pattern of the OLEDs may be matched to a similar emission pattern. Otherwise, the angular dependence of the emission from the display may be distorted. For example, the emission colors may change in color and/or intensity with the angle. This may be observed when rendering 'white' light, an issue sometimes described as white angular dependence (WAD).

In some embodiments, microcavities may be used for the OLED pixels to match the angular dependence emission of the nanorods. The cavities may be to be tuned to have a specific angular dependence profile. For example, to render a 'faster' reduction in emission intensity (efficiency) as a function of angle, the cavity may be tuned to a point 'bluer' in wavelength than the emission peak wavelength of the OLED emitter.

In some embodiments, 'correcting' the emission profile of the nanorods may be employed where a more Lambertian-like emission pattern is required from the display, for example, in a television application. The OLED emission may be close to Lambertian to prevent image distortion at wider angles than normal to the display surface. The emission from the nanorods may be 'corrected'. This may be done using a scattering layer located close to the nanorods within the light emission cone. The distance between the nanorods and scattering layer may be small relative to the lateral sub-pixel dimensions of the display so as to avoid parallax and/or blurring issues in images rendered in the display.

In some embodiments, a layer of nano-particle antennas (NPAs) may be used for the purpose of scattering the nanorods emission. The scattering elements may be deposited through ink jet printing (IJP) or other suitable method. This method may be combined with plasmonic OLED sub-pixels, where NPA layers may be located in front of the emissive surfaces of all LED and OLED pixels.

As for the emission color of LEDs, for typical multi-quantum well GaN/InGaN nanorod LEDs, the emission color may change as a function of drive current e.g. see the following reference where the color is blue shifted with drive current and/or power. In a display application, the emission color of each sub-pixel may typically remain fixed, and the intensity may be varied in order to render grey-scale in the display images without color distortion. Additional ways to mitigate this are presented below.

Pulsed waveforms may be provided to the nanorod sub-pixels when emission is needed within a given frame. The waveforms may be pulsed to maintain a given color spectrum. Power may be applied to the pixel to render the required color, and may be pulsed within a given frame to generate a predetermined number of photons, which may correlate with an intensity for a given frame. A similar approach was disclosed, for example, U.S. Patent Application Publication No. 2015/0213747 and U.S. Pat. No. 10,263,050, which are incorporated by reference in their entirety. Alternatively, this approach may be combined with a display where the color generated by the nanorods as a function of power may be known, and an internal display look-up table or algorithm may be used to take advantage of the color shift depending on the color point required from a given pixel, which may be distinct from sub-pixel color.

That is, embodiments of the disclosed subject matter provide a full-color pixel arrangement for a full-color display (e.g., as shown in FIG. 3), where the arrangement has a plurality of pixels, with each pixel including a first sub-pixel comprising a Group III-V inorganic emissive thin film configured to emit light of a first color, where there is at least one first sub-pixel per pixel of the full-color pixel arrangement. The Group III-V inorganic emissive films may be chemical compounds with at least one Group III element (the Boron group) and at least one Group V element (the nitrogen group). Each pixel may include an organic second sub-pixel and an organic third sub-pixel that are configured to emit light of a different color than the first color. In some embodiments, the emitted light of first color may be blue light, and the light emitted by the second and third sub-pixels may be a different color than the blue light. In some embodiments, the Group III-V inorganic emissive thin film comprises inorganic emitting nanorods.

The first sub-pixel of the full-color pixel arrangement may have a plurality of emissive regions. The plurality of emissive regions may be independently addressable.

In some embodiments, the second sub-pixel of the full-color pixel arrangement may configured to emit light of a second color, the third sub-pixel configured to emit a third color. For example, the first sub-pixel may emit light of a first color which may be blue, the second sub-pixel may emit light of second color that may be green, and the third sub-pixel may emit light of a third color which may be red.

The full-color pixel arrangement may include a stack arrangement in some embodiments. For example, the second sub-pixel may have a first portion of an organic emissive stack configured to emit an initial color that is different from the first color. The third sub-pixel may include a second portion of the first organic emissive stack, and a first color altering layer disposed in a stack with the second portion of the first organic emissive stack. In some embodiments, a fourth sub-pixel may be configured to emit light a fourth color different from the initial color. For example, the fourth color may be yellow. The fourth sub-pixel may include a third portion of the first organic emissive stack, and a second color altering layer disposed in a stack with the third portion of the first organic emissive stack. The color altering layer may be a color filter and/or color changing media. The fourth sub-pixel may be configured to emit light of a different color than the first color. For example, in the embodiments described above, the first color may be blue, the second color may be green, the third color may be red, and the fourth color may be yellow. That is, is some embodiments, the second, third, and fourth sub-pixels may be different portions of an organic emissive stack of the same device. In other embodiments, the different portions of the stack for the second sub-pixel, the third sub-pixel, and the fourth sub-pixel may be emissive stacks of different devices.

For the stack arrangement describe above, the organic emissive stack may be disposed on at least one of a plurality of independently addressable emissive regions of the Group III-V inorganic emissive thin film. The organic emissive stack may be disposed non-overlapping to the Group III-V inorganic emissive thin film. The organic emissive stack may be part of an organic light emitting device (OLED). The OLED may include a phosphorescent emissive region. The OLED may include a thermally activated delayed fluorescence (TADF) material or electrically-driven quantum dots disposed in the organic emissive stack. The OLED may be unpatterned yellow, and green and red light may be output via color filters or color changing media.

In other embodiments, the sub-pixels may have a side-by-side arrangement, rather than the stacked arrangement described above. In the side-by-side arrangement, the second sub-pixel may be disposed adjacent to the first sub-pixel and may be configured to emit an initial color different from the first color, and may have a color altering layer disposed over the light generating device (e.g., one of the subpixels). The third sub-pixel may have a first color altering layer disposed on at least one of the first sub-pixel and the second sub-pixel. A fourth sub-pixel may configured to emit light a fourth color different from the initial color, the fourth sub-pixel disposed adjacent to the first sub-pixel, the second sub-pixel, and the third sub-pixel. The fourth sub-pixel may be configured to emit light of a different color than the first color. In this side-by-side arrangement, the first color may be blue, the second color may be green, the third color may be red, and the fourth color may be yellow.

In the side-by-side arrangement, at least the first sub-pixel and the second sub-pixel may be part of an OLED. The OLED may include a phosphorescent emissive region. The OLED may include a thermally activated delayed fluorescence (TADF) material or electrically-driven quantum dots. The OLED may be unpatterned yellow, and green and red light may be generated via color filters and/or color changing media.

In any of the arrangements disclosed above, the inorganic emissive thin film may be deposited using at least one of thermal evaporation, deposition through a mask, cold welding, and/or patterning. The full-color pixel arrangements described above may have first color as blue, the second color as green, and the third color as red.

The emissive area of the first sub-pixel of the embodiments described above may be less than 50%, less than 25%, or less than 10% of an area of the first sub-pixel. In some embodiments, a scattering layer may be disposed on the inorganic emissive thin film.

In the embodiments described above, the first sub-pixel may be configured to receive pulsed waveforms from a controller to maintain a fixed color spectrum. The first color generated by the inorganic emissive thin film may be based on a function of power and a value from a color look-up table. A data driver may be configured to drive two or more anode pads of the inorganic emissive thin film regions of the first sub-pixel. The data driver may be configured to determine whether any of the two or more anode pads are non-functional, and mapping non-functional emissive areas based on the determination. A controller may be configured to change a light output from the first sub-pixel if one of the two or more anode pads is non-operational to provide a predetermined sub-pixel luminance. The data driver may be configured to drive at least one of the first sub-pixel, the second sub-pixel, the third sub-pixel.

In the embodiments described above, an angular dependence emission of cavities of the plurality of independently addressable emissive regions may be tuned to a predetermined angular dependence.

In some embodiments, the full-color pixel arrangement, such as shown in FIG. 4, the first sub-pixel may shared with at least one other pixel of the full-color pixel arrangement. That is, at least one inorganic sub-pixel may be shared between two pixels.

Embodiments of the disclosed subject matter may be provided for a method of forming a full-color pixel arrangement for a full-color display, the arrangement comprising a plurality of pixels, where forming each pixel may include forming a first sub-pixel comprising a Group III-V inorganic emissive thin film configured to emit light of a first color, where there is at least one first sub-pixel per pixel of the full-color pixel arrangement. The method may include forming an organic second sub-pixel and an organic third sub-pixel that are configured to emit light of a different color than the first color. The method may include forming the Group III-V inorganic emissive thin film of the first sub-pixel using inorganic emitting nanorods.

In the embodiments disclosed above, the first sub-pixel may be formed with a plurality of emissive regions. The forming the first sub-pixel may include forming the plurality of emissive regions to be independently addressable. The second sub-pixel may be formed by forming a first portion of an organic emissive stack configured to emit an initial color different from the first color.

In some embodiments, the method may include forming the organic emissive stack as part of an OLED. The OLED may be deposited using at least one selected of Organic Vapor Jet Printing (OVJP), ink jet printing (IJP), Organic Vapor Phase Deposition (OVPD), Vacuum Thermal Evaporation (VTE), organic molecular beam deposition, spin coating, doctor blade, thermal transfer, stamping, lithography, spray transfer, atomic layer deposition (ALD), Langmuir-Blodgett film deposition, and/or chemical vapor deposition, and/or self-assembled films.

In some embodiments, the first sub-pixel and the second sub-pixel are part of an organic light emitting device (OLED). The OLED may be deposited using at least one selected of Organic Vapor Jet Printing (OVJP), ink-jet printing (IJP), Organic Vapor Phase Deposition (OVPD), Vacuum Thermal Evaporation (VTE), organic molecular beam deposition, spin coating, doctor blade, thermal transfer, stamping, lithography, spray transfer, atomic layer deposition (ALD), Langmuir-Blodgett film deposition, and/or chemical vapor deposition, and/or self-assembled films.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A full-color pixel arrangement for a full-color display, the arrangement comprising a plurality of pixels, each pixel comprising:
a first sub-pixel comprising an inorganic emissive thin film configured to emit light of a first color, wherein the first sub-pixel has a plurality of emissive regions that are addressable, and wherein there is at least one first sub-pixel per pixel of the full-color pixel arrangement; and
an organic second sub-pixel and an organic third sub-pixel that are configured to emit light of a different color than the first color, wherein the organic second sub-pixel is configured to emit light of a second color, and the organic third sub-pixel configured to emit light of a third color,
wherein the organic second sub-pixel comprises a first portion of an organic emissive stack configured to emit an initial color different from the first color, and
wherein the organic emissive stack is disposed non-overlapping to the inorganic emissive thin film.

2. The full-color pixel arrangement of claim 1, wherein the inorganic emissive thin film comprises inorganic emitting nanorods.

3. The full-color pixel arrangement of claim 1, wherein the plurality of emissive regions are independently addressable.

4. The full-color pixel arrangement of claim 1e, wherein the organic third sub-pixel comprises:
a second portion of the organic emissive stack; and
a first color altering layer disposed in a stack with the second portion of the organic emissive stack.

5. The full-color pixel arrangement of claim 1, wherein the organic second sub-pixel is disposed adjacent to the first sub-pixel.

6. The full-color pixel arrangement of claim 5, wherein the organic third sub-pixel comprises:
a first color altering layer disposed on at least one of the first sub-pixel and the organic second sub-pixel.

7. The full-color pixel arrangement of claim 5, wherein at least the first sub-pixel and the organic second sub-pixel are part of a hybrid display device.

8. The full-color pixel arrangement of claim 7, wherein the hybrid display device includes a phosphorescent emissive region.

9. The full-color pixel arrangement of claim 7, wherein the hybrid display device includes a thermally activated delayed fluorescence (TADF) material or electrically-driven quantum dots.

10. The full-color pixel arrangement of claim 1, wherein an emissive area of the first sub-pixel is selected from the group consisting of: less than 50%, less than 25%, and less than 10% of an area of the first sub-pixel.

11. The full-color pixel arrangement of claim 1, further comprising:
a data driver configured to drive two or more anode pads of the emissive regions of the first sub-pixel.

12. The full-color pixel arrangement of claim 11, wherein the data driver is configured to determine whether any of the two or more anode pads are non-functional, and to map non-functional emissive areas based on the determination.

13. The full-color pixel arrangement of claim 11, further comprising a controller configured to change a light output from the first sub-pixel if one of the two or more anode pads is non-operational to provide a predetermined sub-pixel luminance.

14. The full-color pixel arrangement of claim 1, wherein the first sub-pixel is shared with at least one other pixel of the full-color pixel arrangement.

15. The full-color pixel arrangement of claim 1, wherein the inorganic emissive thin film of the first sub-pixel comprises a Group III-V inorganic emissive thin film.

16. The full-color pixel arrangement of claim 1, wherein an organic phosphorescent material is included in at least one selected from the group consisting of:
the organic second sub-pixel, and the organic third sub-pixel.

17. A method of forming a full-color pixel arrangement for a full-color display, the arrangement comprising a plurality of pixels, wherein forming each pixel comprises:
forming a first sub-pixel comprising an inorganic emissive thin film configured to emit light of a first color, wherein the first sub-pixel has a plurality of emissive regions that are addressable, and wherein there is at least one first sub-pixel per pixel of the full-color pixel arrangement; and
forming an organic second sub-pixel and an organic third sub-pixel that are configured to emit light of a different color than the first color, wherein the organic second sub-pixel is configured to emit light of a second color, and the organic third sub-pixel configured to emit light of a third color,
wherein the organic second sub-pixel comprises a first portion of an organic emissive stack configured to emit an initial color different from the first color, and
wherein the organic emissive stack is disposed non-overlapping to the inorganic emissive thin film.

18. The method of claim 17, wherein the inorganic emissive thin film of the first sub-pixel that is formed comprises inorganic emitting nanorods.

19. The method of claim 17, wherein the plurality of emissive regions of the first sub-pixel pixel that is formed are independently addressable.

* * * * *